United States Patent
Müller et al.

[11] Patent Number: 6,069,491
[45] Date of Patent: May 30, 2000

[54] INTEGRATED BUFFER CIRCUIT

[75] Inventors: Gerhard Müller, Wappingers Falls, N.Y.; Thomas Kristoffersson, München, Germany

[73] Assignee: Siemens Aktiengesellschaft, Munich, Germany

[21] Appl. No.: 09/174,745

[22] Filed: Oct. 19, 1998

Related U.S. Application Data

[63] Continuation of application No. PCT/DE98/00433, Feb. 16, 1998.

[30] Foreign Application Priority Data

Feb. 17, 1997 [DE] Germany .................. 197 06 069

[51] Int. Cl.[7] .............................................. H03K 19/0185
[52] U.S. Cl. .................. 326/70; 326/81; 326/83
[58] Field of Search .................. 326/81, 83, 86, 326/70, 71, 112, 119, 121

[56] References Cited

U.S. PATENT DOCUMENTS

| | | | |
|---|---|---|---|
| 4,501,978 | 2/1985 | Gentile et al. | 326/71 |
| 4,700,086 | 10/1987 | Ling et al. | 326/121 |
| 4,713,561 | 12/1987 | Yamada . | |
| 5,117,131 | 5/1992 | Ochi et al. | 326/81 |
| 5,144,167 | 9/1992 | McClintock | 326/71 |
| 5,349,246 | 9/1994 | McClure | 326/121 |
| 5,412,331 | 5/1995 | Jun et al. | 326/121 |
| 5,565,795 | 10/1996 | Kawano . | |
| 5,831,452 | 11/1998 | Nowak et al. | 326/121 |

FOREIGN PATENT DOCUMENTS

| | | |
|---|---|---|
| 0587938A1 | 3/1994 | European Pat. Off. . |
| 3-153122 | 7/1991 | Japan . |
| 5-63543 | 3/1993 | Japan . |
| 5-268054 | 10/1993 | Japan . |

OTHER PUBLICATIONS

Japanese Patent Abstract No. 60–70822 (Sasaki et al.), dated Apr. 22, 1985.
Japanese Patent Abstract No. 61–62230 (Takeuchi), dated Mar. 31, 1986.

*Primary Examiner*—Jon Santamauro
*Assistant Examiner*—Don Phu Le
*Attorney, Agent, or Firm*—Herbert L. Lerner; Laurence A. Greenberg; Werner H. Stemer

[57] ABSTRACT

The buffer circuit of the invention converts TTL level input signals to CMOS level output signals. The buffer circuit has three inverter stages, in which the output signal of one stage is positively fed back, in order to achieve complete modulation. Because of a current limiting circuit, the current consumption of the buffer circuit does not exceed a defined value. Despite a high switching speed, the power consumption of the circuit is low.

4 Claims, 1 Drawing Sheet

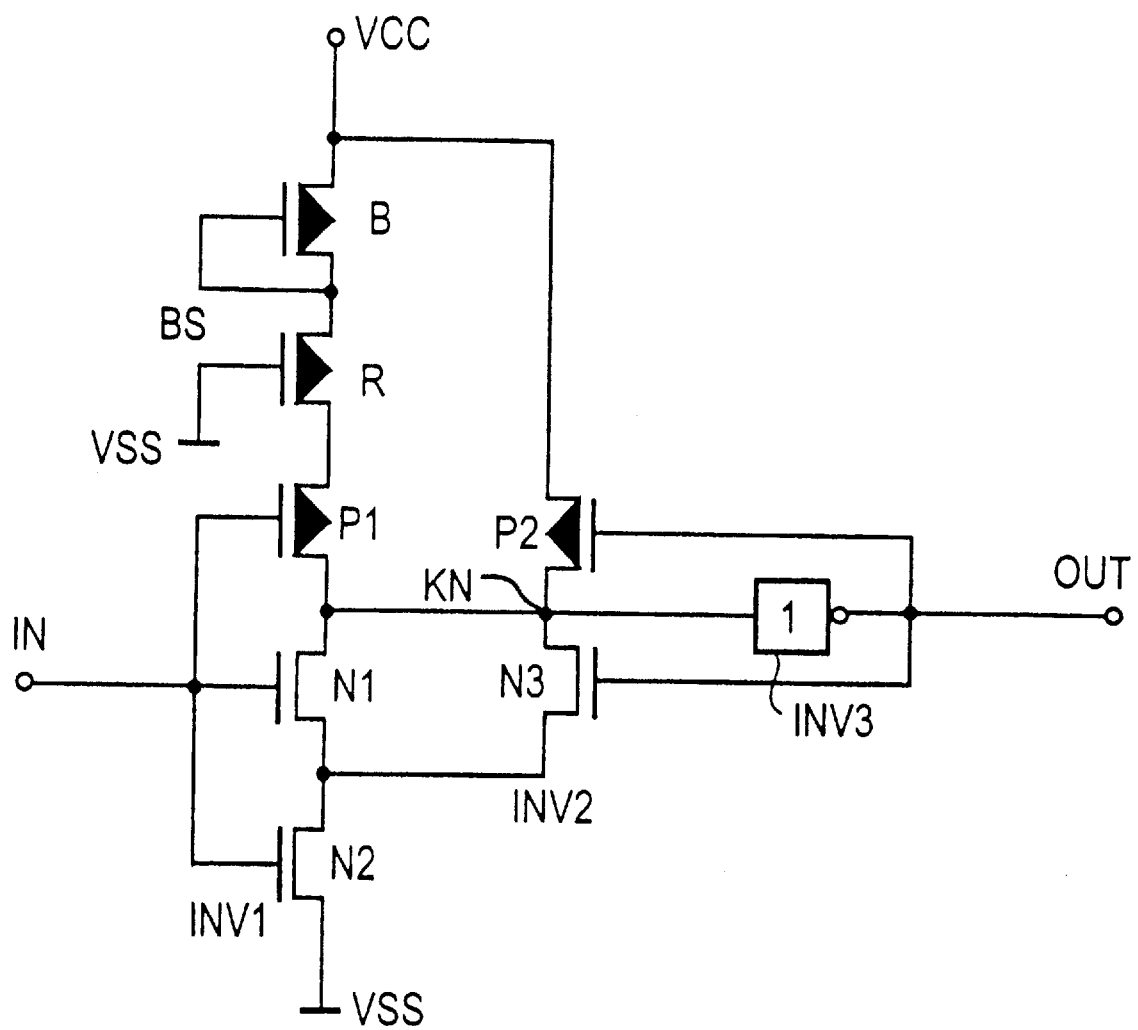

INTEGRATED BUFFER CIRCUIT

CROSS-REFERENCE TO RELATED APPLICATION

This is a continuation of copending International Application PCT/DE98/00433, filed Feb. 16, 1998, which designated the United States.

BACKGROUND OF THE INVENTION

1. Field of the Invention

The invention lies in the field of integrated circuits. More specifically, the invention pertains to an integrated buffer circuit with an input inverter, a feedback inverter, and an output inverter. The integrated buffer circuit has the following characteristics:

the input inverter is a CMOS inverter and includes at least one transistor of one conductivity type and one other transistor of the other conductivity type, with the gates of the transistors connected to an input terminal of the circuit;

the output inverter is connected in series in terms of signals to the input inverter via a circuit node and is connected by its output to an output terminal of the circuit;

an input of the feedback inverter is connected to the output terminal and an output of the feedback inverter is connected to the circuit node; and the source terminal of the other transistor of the input inverter is connected to a first supply potential.

Various families of circuits have become established in the course of the development of integrated circuitry. The various circuit families are distinguished from one another by their circuit concepts, integration density, and electrical data. There are differences particularly in the level of the operating voltages.

The first generation of integrated circuits, which has gained wide use, is that of bipolar TTL low-scale and medium-scale integrated circuits, particularly for digital applications. Even today, the first generation is still important and can be found along with CMOS circuits that were developed later. Both TTL logic and CMOS logic can also be found inside one circuit. The various operating voltages of these circuit families must be taken into account, and level conversion is necessary. So-called buffers are used to convert the TTL level to the internal CMOS level in the chip.

European patent disclosure EP 0 587 938 A1 discloses an integrated buffer circuit with two series-connected inverters. The first inverter is a CMOS inverter. The output signal of the second inverter is positively fed back via a further inverter to the input signal of the second inverter. A constant current source impresses a constant current into the channel-side path of the first inverter. With the aid of enable transistors, the first inverter and a constant current source can be turned off, thus increasing the efficiency of the input signal of the buffer circuit, at times when intensive disturbances can be expected. A disadvantage of the known buffer circuit is its high rest current, which primarily flows as transverse current through the first inverter, when a TTL signal at a high level is present at the input of the buffer circuit and therefore the transistors of the CMOS inverter are conducting.

When no switching signal is expected, the buffer circuit can be inactivated and the rest current lowered via the enable transistors. To control the enable transistors, a signal must be present. Applications exist in which such a signal cannot be made available. In dynamic memories, for instance, the RAS control signal, which controls loading the address into the address register and addressing the row to be addressed in the memory matrix, is weighted by an RAS buffer, or in other words, the state of the RAS control signal is evaluated continuously, which precludes inactivation of the buffer.

SUMMARY OF THE INVENTION

It is accordingly an object of the invention to provide an integrated buffer circuit, which overcomes the above-mentioned disadvantages of the heretofore-known devices and methods of this general type and which provides a circuit concept for a buffer that has a considerably lower rest current at the input-side TTL level than known buffer circuits, while largely maintaining the switching speeds previously attained.

With the foregoing and other objects in view there is provided, in accordance with the invention, an integrated buffer circuit, comprising:

a CMOS input inverter including a first transistor of a first conductivity type and a second transistor of a second conductivity type, the first and second transistors each having a gate connected to an input terminal of the circuit;

an output inverter connected in series between the input inverter and an output terminal of the circuit;

a feedback inverter having an input connected to the output terminal and an output connected to a circuit node between the input inverter and the output inverter;

a source of the second transistor being connected to a first supply potential; and a series circuit for limiting a rest current through the input inverter connected between a second supply potential and the source terminal of the first transistor of the input inverter, the series circuit including at least a transistor, connected as a diode, and an ohmic resistor.

In accordance with an added feature of the invention, the ohmic resistor is a MOS transistor having a gate terminal connected to the first supply potential.

In accordance with another feature of the invention, the transistor connected as a diode is a p-channel type transistor.

In accordance with a concomitant feature of the invention, the MOS transistor is a p-channel type transistor.

The invention has the advantage that the power consumption is low because of the low static rest current, i.e., quiescent current. Since a plurality of buffers may be present in a single integrated circuit, the total power consumption of the chip can be reduced markedly. In DRAMs, for instance, buffers can be used for the control signals for addressing both rows and columns, and for the read-write signal. The problem of dissipating the lost heat is also made less critical. Even at an elevated effective supply voltage, a reduction in the rest current is achieved.

A further advantage is that known circuit concepts can easily be expanded to make the circuit of the invention. The additional expense for current limitation involves only slight additional cost. No additional control terminals are needed.

Other features which are considered as characteristic for the invention are set forth in the appended claims.

Although the invention is illustrated and described herein as embodied in integrated buffer circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole FIGURE is a circuit schematic of a buffer circuit of the invention.

DESCRIPTION OF THE PREFERRED EMBODIMENT

Referring now to the figures of the drawing in detail, there is seen a buffer circuit that includes a limiting transistor B, a resistor R, and an input inverter INV1. These three components are connected in series between a first supply potential VCC and a second supply potential VSS. A MOS transistor connected as a diode, that is, whose gate and drain terminals are short-circuited, is contemplated as the limiting transistor B. The limiting transistor B is connected to the first supply potential VCC by its source terminal. The resistor R is implemented as a further MOS transistor, whose gate terminal is connected to the second supply potential VSS. The resistor R can be replaced by a resistor network. Both MOS transistors B and R are of the P-channel type in this case.

The input inverter INV1 is a CMOS inverter with a first p-channel transistor P1, a first n-channel transistor N1, and a second n-channel transistor N2, whose gate terminals are connected to an input terminal IN of the circuit and which are connected in series with one another toward the channel.

The drain terminal of the first p-channel transistor P1, which is interconnected with the drain terminal of the first n-channel transistor N1, forms the output of the input inverter INV1 and is connected to a circuit node KN.

The circuit node KN is also connected both to the input of an output inverter INV3 and to the output of a feedback inverter INV2. The feedback inverter INV2 here is a CMOS inverter, comprising a second p-channel transistor P2 and a third n-channel transistor N3, whose gate terminals are interconnected and are connected to the output of the output inverter INV3.

The source terminal of the second p-channel transistor P2 is connected to the first supply potential VCC. The source terminal of the third n-channel transistor N3 is connected to the drain terminal of the second n-channel transistor N2. The source terminal of the third n-channel transistor N3 may also be connected directly to the second supply potential VSS. In that case, the first n-channel transistor N1 can be omitted.

The output of the output inverter INV3 is connected to an output terminal OUT of the circuit.

The serial arrangement comprising the limiting transistor B and the resistor R, which is connected between the first supply potential VCC and the input inverter INV1, forms a current limiting circuit BS. The first supply potential VCC acts as a supply source for the input inverter INV1.

The resistor R linearly limits the transverse current flowing through the input inverter INV1. The limiting transistor B, because of its non-linear transmission characteristic curve, limits the current flowing through it to a value that is dependent both on the transistor geometry and on the resistance of the resistor R. The gate potential rises, and a further increase in the channel current is counteracted, to the extent to which the channel current of the limiting transistor increases.

When the buffer circuit is used as a level converter from the TTL level to the CMOS level, the first supply potential VCC is typically 5 volts, and the second supply potential VSS is typically 0 volts. If a TTL signal with a low level (typically 0 volts) is applied to the input terminal IN, then the first p-channel transistor P1 is made conducting while the first and second n-channel transistors N1, N2 remain blocked. No static transverse current (i.e., rest current) flows via the input inverter INV1.

If the TTL signal assumes a high level (typically 2.4 volts), then the threshold voltage of the first p-channel transistor P1 is not exceeded, and it, like the first and second n-channel transistors N1, N2 is conducting. A permanent static inverse current flows through the input inverter INV1. With the modulation of the third n-channel transistor N3 of the feedback inverter INV2, which is connected parallel on the channel side to the first n-channel transistor N1, a further current path of the transverse current is made available.

At the switchover of the input inverter INV1 from one logical state to the other, a high transverse current is desired, in order to achieve a rapid recharging of the capacitances of the input inverter INV1. For the static state, which in the normal case prevails most of the time, however, an unnecessary high supply power must be made available for the high transverse current for the TTL signal with a high level.

To avoid this, the transverse current is reduced by means of the current limiting circuit BS in such a way that an adequate switching speed of the buffer circuit is still assured.

With the current limiting circuit bs, a supply current that is lower by approximately the factor of 10, at virtually the same switching speed, is established, as compared with a generic buffer circuit without current limitation.

We claim:

1. An integrated buffer circuit, comprising:
   an input terminal and an output terminal;
   a CMOS input inverter including a first transistor of a first conductivity type and a second transistor of a second conductivity type, said first and second transistors each having a gate connected to said input terminal and a source;
   an output inverter connected in series between said input inverter and said output terminal;
   a feedback inverter having an input connected to said output terminal and an output connected to a circuit node between said input inverter and said output inverter;
   said source of said second transistor being connected to a first supply potential; and
   a series circuit for limiting a rest current through said input inverter connected between a second supply potential and said source terminal of said first transistor of said input inverter, said series circuit including at least a transistor, connected as a diode having a substantially non-linear transfer characteristic, and an ohmic resistor having a substantially linear transfer characteristic.

2. The integrated buffer circuit according to claim 1, wherein said ohmic resistor is a MOS transistor having a gate terminal connected to the first supply potential.

3. The integrated buffer circuit according to claim 1, wherein said transistor connected as a diode is a p-channel type transistor.

4. The integrated buffer circuit according to claim 2, wherein said MOS transistor is a p-channel type transistor.

* * * * *